United States Patent [19]
Shiralagi

[11] Patent Number: 5,846,609
[45] Date of Patent: Dec. 8, 1998

[54] MASKING METHODS FOR SEMICONDUCTOR MATERIALS

[75] Inventor: Kumar Shiralagi, Chandler, Ariz.

[73] Assignee: Motorola, Inc., Schaumburg, Ill.

[21] Appl. No.: 775,934

[22] Filed: Jan. 3, 1997

Related U.S. Application Data

[63] Continuation-in-part of Ser. No. 511,772, Aug. 7, 1995, Pat. No. 5,730,798.

[51] Int. Cl.$^6$ ..................................................... C08J 7/04
[52] U.S. Cl. ...................... 427/510; 427/225; 427/255.2; 427/255.3; 427/255.4; 427/259; 427/261; 427/282; 427/443.2; 427/583; 427/585; 437/225
[58] Field of Search ..................................... 427/583, 585, 427/255, 255.2, 255.3, 255.4, 259, 261, 282, 443.2, 510; 437/225

[56] References Cited

U.S. PATENT DOCUMENTS

| | | | |
|---|---|---|---|
| 4,472,459 | 9/1984 | Fisher | 427/93 |
| 5,451,425 | 9/1995 | Vig | 427/255.4 |
| 5,556,590 | 9/1996 | Hull | 427/554 |

*Primary Examiner*—Bernard Pianalto
*Attorney, Agent, or Firm*—Eugene A. Parsons

[57] ABSTRACT

A method of forming a mask including providing a fluid from a group including oxygen based, nitrogen based, or carbon based fluids, introducing a substrate of semiconductor material into the fluid, and growing a film with thickness in a range of 10–20 Å on a surface by converting the fluid adjacent the surface into a reactive species. The reactive species is created by directing light having a wavelength at the absorption peak of the fluid so as to convert the fluid into the reactive species. The surface of the substrate reacts with the reactive species to form the film.

11 Claims, 1 Drawing Sheet

MASKING METHODS FOR SEMICONDUCTOR MATERIALS

RELATED APPLICATIONS

This application is a continuation-in-part of U.S. patent application entitled "Improved Masking Methods During Semiconductor Device Fabrication", Ser. No. 08/511,772, filed Aug. 7, 1995, U.S. Pat. No. 5,730,798 and assigned to the same assignee.

FIELD OF THE INVENTION

The present invention pertains to the fabrication of semiconductor devices and more specifically to improved masking techniques during semiconductor device fabrication.

BACKGROUND OF THE INVENTION

In the semiconductor field it is common to sequentially grow several different layers of semiconductor material and use various masks and etching steps to form the desired devices and terminals on the devices. In some methods, masking material, e.g. nitride, oxide, or the like, is applied and photoresist is used to pattern the masking material. Material is grown/deposited/etched using masked and unmasked areas in subsequent processes. The material on the masked areas is then removed by etching and/or lift-off. In some instances material is selectively grown in unmasked areas and the masking material is then removed. One problem that arises is that the structure or substrate (generally a wafer) must be removed from the growth chamber to remove the masking material. The structure is then masked again and reintroduced into the growth chamber for re-growth.

Generally, in these prior art methods of fabricating semiconductor devices, etching is required to remove unwanted material and masks are removed by etching, solvent, or the like. During the etching and/or mask forming or removal processes, the material of the semiconductor device has a high likelihood of being contaminated by the etchant, which contamination greatly reduces the life of the device, the operating characteristics of the device, and the reliability of the device. Further, the etching process severely damages semiconductor material adjacent the etched areas which further reduces life, operating characteristics, and reliability. Also, etching processes are very time consuming and difficult to perform.

In addition to the etching problems, all known prior art fabrication processes require many interspersed growing, masking and etching steps which greatly complicate and lengthen the process. For example, when epitaxial layers are grown, the wafers must be placed in a vacuum or pressure chamber to provide the atmosphere for the growth. Each time the wafer is patterned, it must be removed from the chamber, resulting in large amounts of preparation time for each step. Also, each time wafers are removed from a chamber and subsequently replaced, the opening and preparation of the chamber (as well as the processing of the wafer) is an opportunity for additional impurities and contaminants to be introduced to the wafer.

Accordingly, it would be highly desirable to provide improved masking processes.

It is a purpose of the present invention to provide a new and improved method of patterning substrates during semiconductor device fabrication.

It is still another purpose of the present invention to provide a new and improved method of masking substrates during the fabrication of semiconductor devices which does not require the introduction of contaminants, such as photoresist, solvents and etchants.

It is a further purpose of the present invention to provide a new and improved method of masking substrates during the fabrication of semiconductor devices which is much simpler and includes less chance of contamination of the devices.

SUMMARY OF THE INVENTION

The above problems and others are at least partially solved and the above purposes and others are realized in a method of forming a mask including providing a fluid, introducing a substrate having a surface into the fluid, and directing light having a wavelength which will convert the fluid into a reactive species onto the surface to grow a film on the surface.

In a more specific embodiment the fluid is chosen from a group including oxygen based, nitrogen based, and carbon based fluids and the light includes a wavelength at the absorption peak of the fluid.

BRIEF DESCRIPTION OF THE DRAWINGS

Referring to the drawings.

DESCRIPTION OF THE PREFERRED EMBODIMENTS

Figure 1:
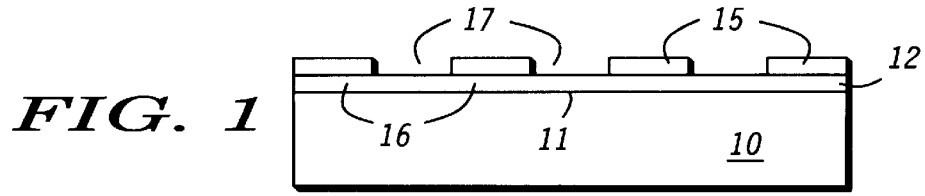
FIGS. 1, 2, 3 and 4 are simplified sectional views of a substrate illustrating several sequential steps in a masking process in accordance with the present invention.
Figure 2:
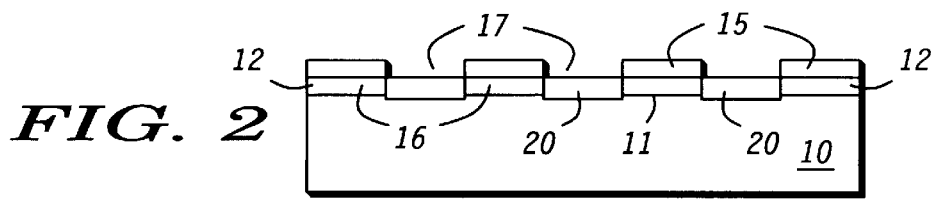

The present invention includes a method of fabricating masks for subsequent use in fabrication of semiconductor devices. Specific methods of fabricating masks and semiconductor devices follow. A method of forming a mask on a substrate includes providing a fluid which can be converted into a reactive species by light having a specific wavelength. Typically, light is selected having a wavelength at the absorption peak of the fluid used. A substrate having a surface to be patterned is positioned in the fluid. A mask, for instance quartz with chrome pattern or metal mask, is placed either in contact or close to the substrate. In some instances a stepper or a generated pattern can be used in place of the mask. By directing light having a wavelength which will convert the fluid into a reactive species onto the surface, a masking film is grown. In most applications, the masking film has a thickness in a range of 10–20 Å. This mask can be formed and removed in situ, greatly simplifying the fabrication of semiconductor devices.

Generally, the fluid is chosen from a group including oxygen based, nitrogen based, or carbon based fluids, depending on the substrate material. It will be understood that the term fluid refers to both gas and liquid materials and includes but is not limited to air, oxygen, and nitrogen gas, ammonia, etc. The substrate material is a semiconductor material preferably chosen of a III–V material and/or silicon. More specifically, the semiconductor material includes GaAs, Si, InP, Ge, SiC, etc. Upon application of the proper light, the fluid is converted to a reactive species which reacts with exposed portions of the surface of the semiconductor material. For example when the substrate includes Gallium, ammonia can be used as the fluid. Light having a wavelength of approximately 193 nm converts the ammonia into a reactive species onto the surface to grow a film of Gallium Nitride. Another specific example is to use a carbon containing fluid to modify Silicon or Gallium to form carbides.

A specific example of the formation of the masking film and/or the reaction between the substrate and the fluid includes providing a GaAs substrate with a native oxide film of Gallium arsenic oxides on the surface. The layer of oxide is approximately 20 angstroms thick and forms on the substrate whenever it is exposed to air (ambient) for a short time. Generally, a thin layer of native oxide is present on the surface if the substrate has been exposed to air. Native oxides cannot be used as a masking film because they include volatile components which vaporize at low temperatures. In this example the native oxide includes $As_2O_3$, $As_2O_5$, and $GaAsO_3$ which vaporize at approximately 580° C. and desorb from the surface. When subjected to deep ultra violet light, in this example 193 nm and/or 248 nm, oxygen in the atmosphere around the substrate (ambient atmosphere containing oxygen) is modified into a reactive species, in this instance, ozone. It should be understood that this process is generally performed at room temperature and under normal room conditions. The ozone reacts with the GaAs substrate to form a $Ga_2O_3$ masking film on the surface. The $Ga_2O_3$ masking film will withstand temperatures up to approximately 645° C., at which temperature the $Ga_2O_3$ masking film begins to disassociate and can be completely removed as the fabrication process may require. Thus a mask is provided which disassociates at a much higher temperature than does the native oxide. It can therefore be used in semiconductor fabrication techniques, an example of which is described below.

Turning now to the drawings, FIGS. 1–4 illustrate several steps in a method of masking a substrate 10, in accordance with the present invention, for the fabrication of semiconductor devices. Referring specifically to FIG. 1, a simplified sectional view of substrate 10 having a planar surface 11 is illustrated. In this specific embodiment, substrate 10 is formed of gallium arsenide (GaAs), but it will be understood by those skilled in the art that other materials known in the art might be utilized. Generally, a thin layer 12 of native oxide is present on surface 11 of substrate 10 if the substrate has been exposed to air. The layer 12 of oxide is approximately 10–20 angstroms thick and forms on substrate 10 whenever it is exposed to air (ambient) for a short time.

Surface 11 of substrate 10 is patterned or otherwise covered with an mask 15 by any convenient method. Mask 15 may be simply a shadow or metal mask or it can be formed in the well known manner with photolithography. In any case, mask 15 is positioned on surface 11, or on layer 12 of native oxide if it is present, so as to define one or more growth areas 16 on surface 11 beneath mask 15 and one or more unmasked portions 17 on surface 11 of substrate 10. In some special applications it may be possible to prevent the growth of layer 12 of native oxide on surface 11, in which case the following process is performed directly on surface 11. For purposes of this explanation, however, it is assumed that layer 12 of native oxide is present.

A second oxide layer 20 is grown on unmasked portions 17 of the native oxide (see FIG. 2) and, as will be understood by those skilled in the art, will form with the native oxide as a portion thereof. In a preferred method of forming second oxide layer 20, substrate 10 is exposed to an ultraviolet source in ambient conditions (air), i.e. no special chamber, etc., to expose the unmasked portions 17 of substrate 10 to a combination of ultraviolet rays and ozone. The UV-ozone process grows a much thicker and denser layer of oxide than the native oxide. While other methods of growing second oxide layer 20 may be devised and used, it should be understood that second oxide layer 20 is formed sufficiently thicker and denser than the native oxide so that selective removal of the native oxide can be accomplished, as will be explained presently. In a specific example, $GaAsO_3$ can be modified to $Ga_2O_3$ to form a more stable oxide mask.

Figure 3:
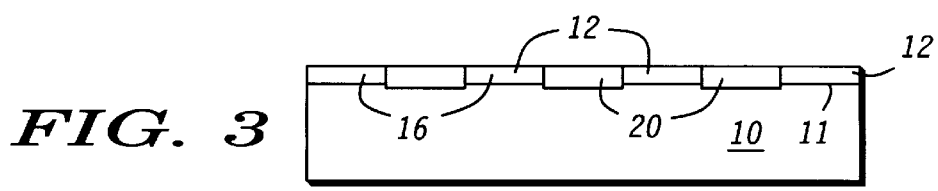
Figure 4:
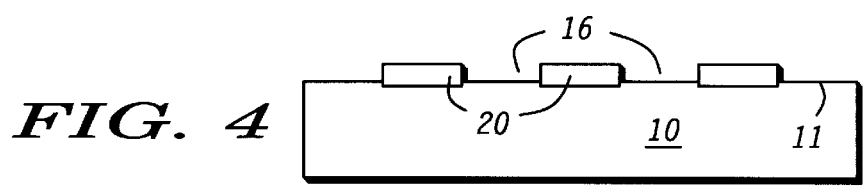

Once oxide layer 20 is grown, mask 15 is removed to expose growth areas 16, as illustrated in FIG. 3. Substrate 10 is then introduced into a growth chamber (not shown) and heated to desorb any native oxide that may be present in growth areas 16. In the present example in which a gallium arsenide substrate is utilized, the substrate is heated in the growth chamber to approximately 580° C.–600° C. to desorb the native oxide in the exposed growth area. Substrate 10 with oxide-free growth areas 16 is illustrated in FIG. 4.

Figure 5:
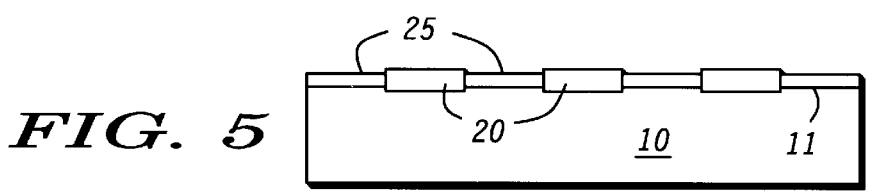
FIG. 5 is a simplified sectional view of the substrate of FIG. 4 with semiconductor material grown on the surface.

While retaining substrate 10 in the growth chamber, selective growth of crystalline, or semiconductor, material 25 in growth areas 16 is performed, as illustrated in FIG. 5. Material 25 can be lattice matched with the material of substrate 10, for instance, in a specific example, Gallium Arsenide is selectively grown at approximately 550° C.–590° C. and lattice matched to the Gallium Arsenide of substrate 10, Indium Arsenide is selectively grown at approximately 500° C.–515° C., etc. With oxide layer 20 in place as a mask for further growth, a predetermined amount of crystalline material 25 is selectively grown in area (or areas) 16. For purposes of this disclosure, "selective growth" or "selectively grown" is defined as growing only in the specific or designated area. Thus, in this example, material 25 grows only in growth areas 16. Further, material 25 generally grows in a crystalline form so that growth rates and shapes are crystallographic dependent, i.e. the rate and shape of growth are dependent upon the type of material 25 being utilized.

Figure 6:
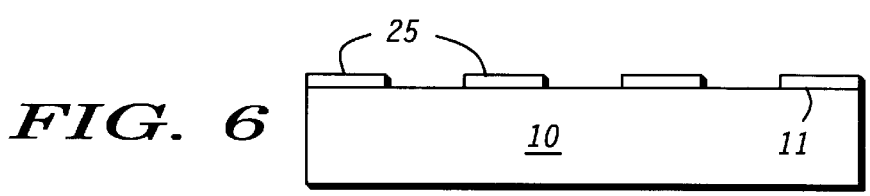
FIG. 6 is a simplified sectional view of the substrate with the mask removed.

Once the desired amount of material 25 is grown in growth areas 16, substrate 10 is heated to a higher temperature under high group V flux in the growth chamber to desorb oxide layer 20. In the present example in which the substrate is gallium arsenide, substrate 10 is heated to approximately 640° C. under high arsenic flux. The higher arsenic flux prevents gallium arsenide desorption during the desorption of oxide layer 20, resulting in the structure illustrated in FIG. 6. Thus, the mask utilized for patterned growth of material 25 is desorbed, or removed, in situ, i.e. without the need to remove substrate 10 from the growth chamber.

Figure 7:
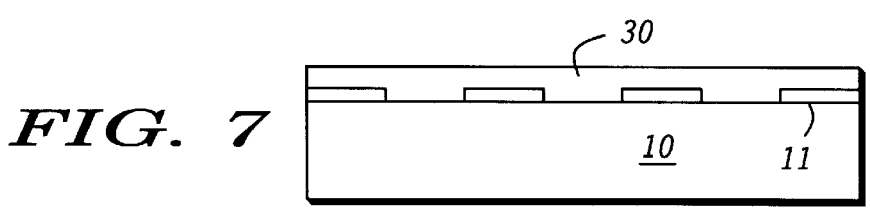
FIG. 7 is a simplified sectional view of the substrate illustrating additional material deposited thereon.

Further growth of material can be performed on crystalline material 25 subsequent to the step of heating substrate 10 to desorb oxide layer 20. As illustrated in FIG. 7, a layer 30 of additional material is grown or deposited on the surface of material 25 and on the exposed surface of substrate 10. Thus, re-growth is performed without having to remove substrate 10 from the growth chamber. It will be apparent to those skilled in the art, after reading this disclosure, that complete semiconductor devices can be formed on substrate 10 without removing it from the growth chamber.

Thus, an improved masking processes is disclosed which provides a new and improved method of masking substrates during semiconductor device fabrication. The new and improved method of masking substrates does not require removal of the substrate from the processing chamber to remove the mask. Because the new and improved method of masking substrates does not require the introduction and removal of wafers or substrates from processing chambers several times in sequence during the fabrication of semiconductor devices, the fabrication process is much simpler and includes less chance of contamination of the devices. The present novel process allows selective growth and further re-growth, all in-situ, without exposure to air and contamination during the intermediate processing steps between epitaxy, etc. By eliminating air and other contaminant exposure between steps, the novel process ensures good quality in subsequent epitaxial steps While I have shown and described specific embodiments of the present invention, further modifications and improvements will occur to those skilled in the art. I desire it to be understood, therefore, that this invention is not limited to the particular forms shown and I intend in the appended claims to cover all modifications that do not depart from the spirit and scope of this invention.

What is claimed is:

1. A method of forming a mask comprising the steps of:
   providing a fluid from a group including nitrogen based, and carbon based fluids;
   introducing a substrate of semiconductor material having a surface into the fluid; and
   forming a film with thickness in a range of 10–20 Å on the surface by converting the fluid adjacent the surface into a reactive species by directing light having a wavelength which will convert the fluid into the reactive species, whereby the surface of the substrate reacts with the reactive species to form the film.

2. A method as claimed in claim 1 further including the steps of:
   positioning a mask adjacent the surface so as to define a growth area and an unmasked portion on the surface; and
   directing the light onto the unmasked portion of the surface to grow a film on the unmasked portion of the surface.

3. A method as claimed in claim 2 wherein the method is performed at room temperature.

4. A method as claimed in claim 1 wherein the step of directing the light includes selecting the light having a wavelength at the absorption peak of the fluid.

5. A method as claimed in claim 1 wherein the step of forming a film includes growing the film.

6. A method as claimed in claim 5 wherein the step of forming the film further includes modifying an existing film and growing additional material.

7. A method of forming a mask for the fabrication of a semiconductor device comprising the steps of:
   providing a fluid from a group including oxygen based, nitrogen based, and carbon based fluids;
   introducing a substrate of semiconductor material having a surface into the fluid so that fluid is adjacent the surface of the substrate;
   positioning a photoresist-free mask adjacent the surface of the substrate so as to define a growth area and an unmasked portion on the surface of the substrate; and
   forming a semiconductor device fabrication masking film on the surface of the substrate by converting the fluid adjacent the unmasked portion of the surface of the substrate into a reactive species by directing light having a wavelength at the absorption peak of the fluid onto the unmasked portion of the surface of the substrate so as to convert the fluid adjacent the unmasked portion of the surface of the substrate into the reactive species, whereby the unmasked portion of the surface of the substrate reacts with the reactive species to form the semiconductor device fabrication masking film on the unmasked portion of the substrate;
   removing the photoresist-free mask to expose the growth area; and
   fabricating a semiconductor device on the substrate utilizing the semiconductor device fabrication masking film and the exposed growth area.

8. A method as claimed in claim 7 wherein the step of forming a film includes growing the film.

9. A method as claimed in claim 8 wherein the step of forming the film further includes modifying an existing film and growing additional material.

10. A method as claimed in claim 7 including in addition the step of heating the substrate during fabrication of the semiconductor device to desorb the semiconductor device fabrication masking film.

11. A method as claimed in claim 7 wherein the step of forming the semiconductor device fabrication masking film includes forming the film with a thickness in a range of 10–20 Å.

* * * * *